(12) United States Patent
Manfred et al.

(10) Patent No.: US 6,961,882 B2
(45) Date of Patent: Nov. 1, 2005

(54) MEMORY CHIP AND APPARATUS FOR TESTING A MEMORY CHIP

(75) Inventors: Dobler Manfred, Ergoldsbach (DE); Finteis Thomas, Munich (DE)

(73) Assignee: Infineon Technologies AG, München (DE)

( * ) Notice: Subject to any disclaimer, the term of this patent is extended or adjusted under 35 U.S.C. 154(b) by 475 days.

(21) Appl. No.: 10/179,002

(22) Filed: Jun. 25, 2002

(65) Prior Publication Data

US 2003/0061554 A1 Mar. 27, 2003

(30) Foreign Application Priority Data

Jun. 26, 2001 (DE) ................................ 101 30 785

(51) Int. Cl.$^7$ ............................................. G11C 29/00
(52) U.S. Cl. ...................... 714/718; 365/201
(58) Field of Search ........................ 714/718; 365/201

(56) References Cited

U.S. PATENT DOCUMENTS

| | | | |
|---|---|---|---|
| 5,619,461 A * | 4/1997 | Roohparvar | 714/718 |
| 5,875,137 A | 2/1999 | Suzuki | |
| 6,480,432 B1 * | 11/2002 | Nakayama | 365/201 |
| 2001/0013110 A1 * | 8/2001 | Pierce et al. | 714/718 |

* cited by examiner

*Primary Examiner*—R. Stephen Dildine
(74) *Attorney, Agent, or Firm*—Jenkins, Wilson & Taylor, P.A.

(57) ABSTRACT

The present invention provides a memory chip (100) which can be operated in a normal mode and in a test mode (TM) and which has a device (102) for outputting data from the memory chip (100) and a device (104) for enabling the device (102) for outputting data when the test mode (TM) has been activated. The device (104) for enabling the device (102) for outputting data has a device for masking data so that only particular portions of the data are output when a data masking state (DQM) has been activated.

8 Claims, 2 Drawing Sheets

MEMORY CHIP AND APPARATUS FOR TESTING A MEMORY CHIP

TECHNICAL FIELD

The present invention relates to a memory chip and to an apparatus for testing a memory chip.

BACKGROUND ART

To be able to guarantee the operability of memory chips over a relatively long period, the memory chips are subjected to artificial aging. If the error rate of memory chips is plotted over their age, then the result is a characteristic curve similar to the shape of a bath tub, i.e. most of the chips are faulty from the outset or become faulty only after an extended time. Artificial aging, generally called burn-in, is carried out in a type of furnace at raised temperature and at raised internal electrical operating voltages.

During artificial aging of the memory chips, said memory chips are operated in a test mode in which, normally, the internal voltage sources for the memory chips are first disconnected and replaced by external voltage sources having higher supplied voltages, and secondly the data which the memory chips output have been inverted. During the test mode, data are written to the memory chips continuously and are read therefrom continuously.

A crucial quality criterion for artificial aging is that the memory chips remain in the test mode throughout the artificial aging process, since otherwise there is no assurance of their being loaded by the raised internal voltages. To be able to single out memory chips which are not in the test mode, activation of the test mode needs to be constantly checked.

Activation of the test mode is normally checked by checking whether a memory chip delivers inverted data, in line with the test mode stipulations. If this his not the case, the memory chip is faulty and/or is assessed as faulty by a tester and can be singled out.

A drawback of checking activation of the test mode using the inverted data is that additional inverters need to be held in the memory chips in order to invert the data, which increases the memory chips' circuit complexity, required chip area, etc.

Another drawback is that, in the memory chip's normal operating mode or normal mode, the required inverters encumber and slow down the data path in the memory chip, since they are always contained in the data path. This is due to the extended delay times through the inverter infrastructure, such as through lines, latches, etc., and to loads, such as capacitive loads, arising as a result of the inverters in the data path.

SUMMARY OF THE INVENTOR

The object of the present invention is to provide a memory chip and an apparatus and a method for testing a memory chip which permit memory chips to be tested with little complexity without adversely affecting the performance of the memory chips.

This object is achieved by a memory chip in accordance with claim 1, by an apparatus for testing a memory chip in accordance with claim 8 and by a method for testing a memory chip in accordance with claim 10.

The subclaims contain advantageous developments and improvements of the memory chip specified in claim 1 and of the apparatus for testing a memory chip specified in claim 8.

In accordance with one preferred development of the memory chip of the present invention, the device for enabling the device for outputting data has a device for masking data so that only particular portions of the data are output when a data masking state has been activated.

In accordance with another preferred development of the memory chip, the enabling device enables the device for outputting data when the data masking state and the test mode have been activated, and does not enable the device for outputting data when the data masking state has been activated and the test mode has not been activated.

In accordance with another preferred development of the memory chip, the enabling device has a NOR gate (NOR) which combines the logic state of the test mode with the negated logic data masking state.

In accordance with another preferred development of the memory chip, the device for outputting data has an off-chip driver (OCD).

In accordance with another preferred development of the memory chip, said memory chip additionally has internal voltage sources which can be deactivated when the test mode has been activated.

In accordance with another preferred development of the memory chip, the memory chip has a synchronous dynamic random access memory (SDRAM).

In accordance with one preferred development of the apparatus for testing a memory chip, the apparatus for testing a memory chip has a device for activating and deactivating the data masking state of the memory chip, which device activates the data masking state when the memory chip is operated in the test mode.

BRIEF DESCRIPTION OF THE DRAWINGS

Preferred exemplary embodiments of the present invention are explained in more detail below with reference to the appended drawings, in which.

DETAILED DESCRIPTION OF THE INVENTION

Figure 1:
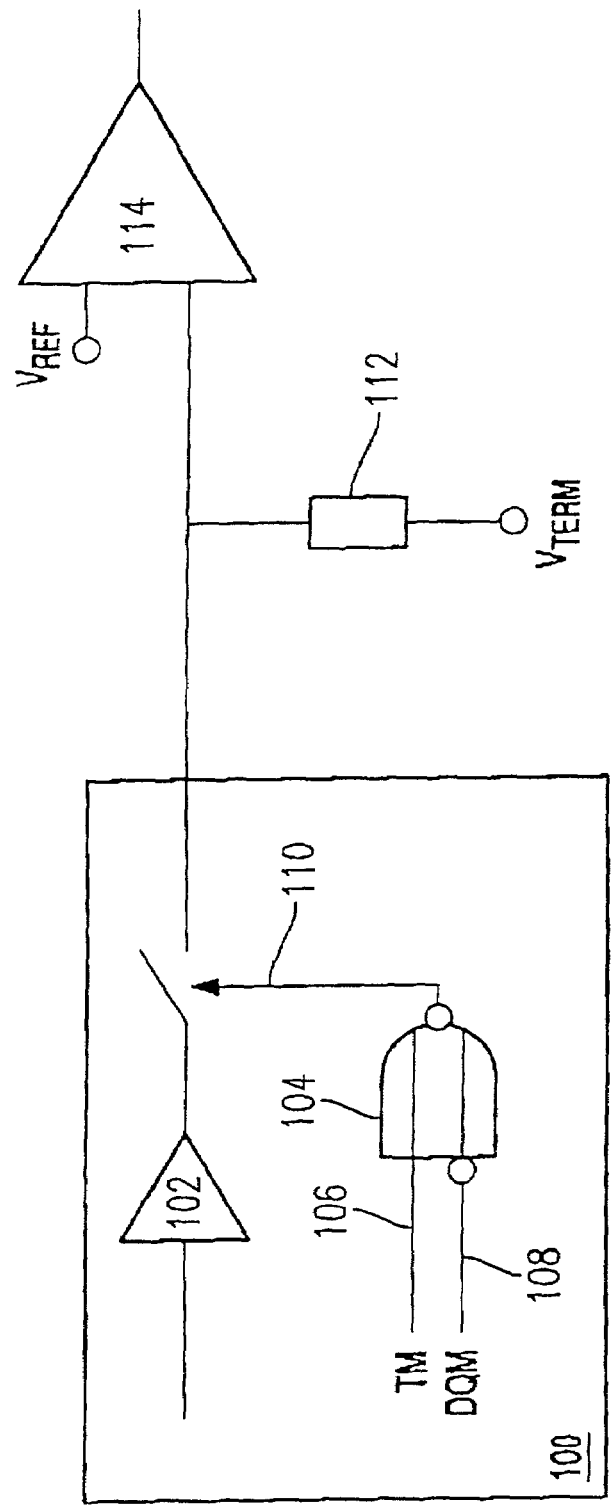
FIG. 1 shows an exemplary embodiment of a memory chip in accordance with the present invention.

FIG. 1 shows an exemplary embodiment of a memory chip in accordance with the present invention. The memory chip 100 can be operated in a normal mode or normal operating mode and in a test mode and is typically split into a cell array and a peripheral array. The memory chip 100 preferably comprises a synchronous dynamic random access memory (SDRAM) and additionally preferably comprises internal voltage sources which can be deactivated when the test mode has been activated. This opportunity for deactivation of the memory chip's internal voltage sources is used, as already mentioned above, to replace application of the relatively low internal operating voltages of the memory chip 100 with application of external voltages having a much higher voltage value during artificial aging of the memory chip.

With further reference to FIG. 1, the memory chip 100 additionally has a device 102 for outputting data from the memory chip 100 and a device 104 for enabling the device 102 for outputting data when the test mode has been activated.

The device 102 for outputting data from the memory chip 100 preferably has an off-chip driver (OCD) which is located in the peripheral zone of the memory chip 100 and, by way of example, amplifies internal signals of the memory chip 100 or adjusts the level of internal signals from an internal level to an external level for signals outside the memory chip 100, in order to be able to operate the memory chip 100 in external circuits.

The device 104 for enabling the device 102 for outputting data preferably has a device for masking the data so that, when a data masking state or data-mask state (DQM) has been activated, only particular portions of the data delivered by the device 102 for outputting data are output. The data are preferably represented by digital signals, and the data are masked, by way of example, in order to select particular bits in a packet or burst of bits, which simplifies testing of the memory chip. Externally, a memory chip preferably also has a DQM contact pin which, when a signal is applied thereto, causes individual bits in a block of bits to be filtered out.

The enabling device 104 preferably enables the device 102 for outputting data when both the data masking state (DQM) and the test mode (TM) have been activated, and does not enable the device 102 for outputting data when only the data masking state (DQM) has been activated and the test mode (TM) has not been activated. In the exemplary embodiment shown in FIG. 1, the enabling device 104 preferably has a NOR gate (NOR) which combines the logic state of the test mode (TM) at an input 106 of the NOR gate with the negated logic data masking state (DQM) at another input 108 of the NOR gate in order to produce therefrom an output signal 110 or enable signal at an output of the NOR gate. The enabling device 104 can have any other suitable combination of logic gates in order to implement its function.

In the exemplary embodiment of a memory chip 100 in accordance with the present invention, as shown in FIG. 1, the device 102 for outputting data is activated, as mentioned, by the enabling device 104, in this case the NOR gate, when the test mode (TM) has been activated. In addition, the data masking state (DQM) likewise needs to have been activated, however, in order for the output signal 110 from the enabling device 104 to enable or activate the device 102 for outputting data. Depending on the state of the device 102 for outputting data, the output of the memory chip 100 therefore either outputs a normal data signal, if the device 102 for outputting data has been activated, or has a high-impedance state, if the device 102 for outputting data has not been activated. The high-impedance state is a tri-state, for example, which is produced by a push-pull output stage with tri-state circuitry for an internal data bus in the memory chip 100 which the device 102 for outputting data uses to deliver desired data. If the device 102 for outputting data has not been enabled even though the data masking state (DQM) has been activated, then the high-impedance state at the output of the device 102 for outputting data can therefore be used to determine whether or not the test mode (TM) has been activated correctly. Activation of the test mode is therefore determined using correct or absent output of data rather than inverted data. If the data are output, the test mode (TM) has been activated or is active.

An output of the memory chip 100 preferably has a resistor 112 connected to it, said resistor being connected to a terminating voltage (Vterm). In addition, a first input of a comparator 114 is connected to the output of the memory chip 100. The other input of the comparator 114 has a reference-ground voltage Vref applied to it which is compared with the voltage drop across the resistor 112, said voltage appearing at the output of the device 102 for outputting data. If the output of the device 102 for outputting data is in a high-impedance state, e.g. a tri-state, then the comparator measures the voltage Vterm, which, when the data masking state (DQM) has been activated, indicates during testing in the test mode that the test mode (TM) has not been activated.

Figure 2:
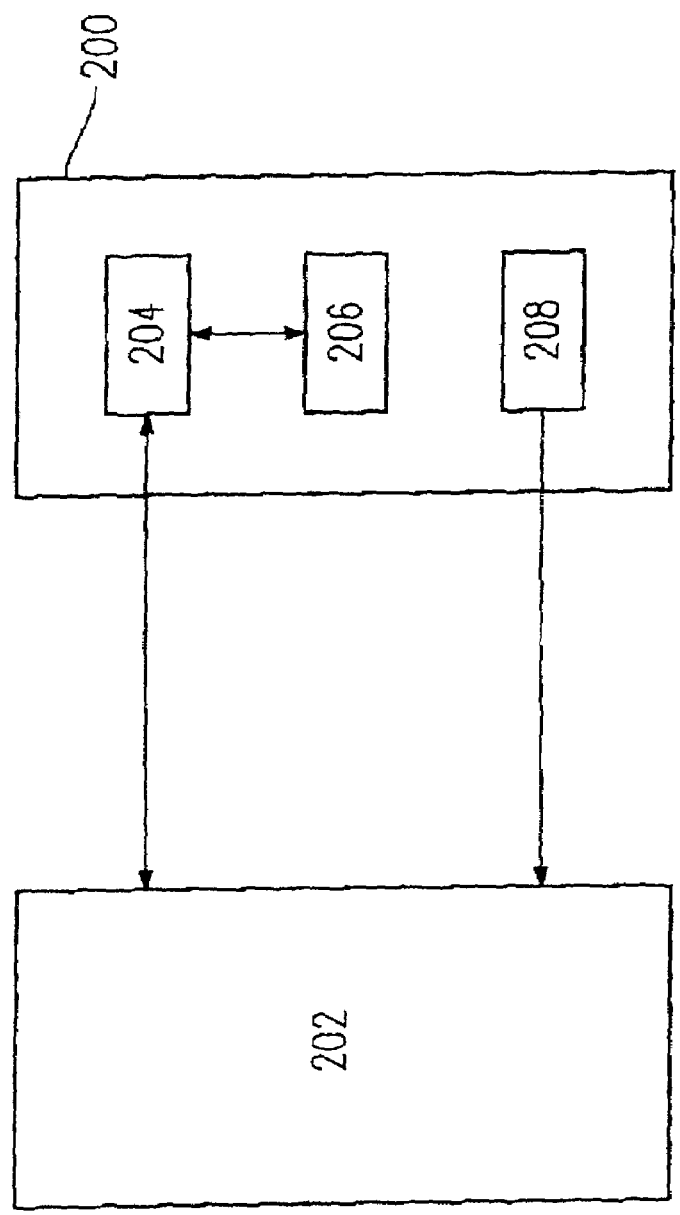
FIG. 2 shows an exemplary embodiment of a testing apparatus in accordance with the present invention.

FIG. 2 shows an apparatus 200 for testing a memory chip 202, which is preferably a memory chip 100 as shown in FIG. 1 and is operated in a test mode. The apparatus 200 for testing the memory chip 202 has a device 204 for continuously sending data to the memory chip 202 and for continuously receiving data from the memory chip 202, and a device 206 for checking the activation of the test mode for the memory chip 202. The checking device 206 establishes or determines that the test mode has been activated if the device 204 for continuously sending and receiving is continuously receiving data from the memory chip 202.

The apparatus 200 for testing a memory chip 202 preferably additionally has a device 208 for activating and deactivating the data masking state (DQM) of the memory chip 202, and activates the data masking state when the memory chip 202 is operated in the test mode (TM). The test mode (TM) for the memory chip 202 is likewise preferably activated by the testing apparatus 200.

The apparatus 200 for testing a memory chip 202, as shown in FIG. 2, is suitable, as mentioned, for testing a memory chip 100 as shown in FIG. 1. In this case, the test mode is checked by virtue of data constantly being sent to the memory chip 202 and by virtue of data constantly being received from the memory chip 202. If the memory chip 202 is operated in the test mode, which can likewise be set by the testing apparatus 200, as mentioned above, the testing apparatus 200 constantly receives data from the memory chip 202, which indicates that the test mode is in an activated state. If, on the other hand, the test mode has not been activated, then the memory chip 202 does not send any data to the testing apparatus 200, and the voltage Vterm shown in FIG. 1, for example, is applied to the input of the testing apparatus 200, since the device 102 (FIG. 1) for outputting data has a high-impedance state at its output.

The device 104 for masking data is activated by the testing apparatus 200 using the device 208 for activating and deactivating the data masking state, and is kept active throughout the entire test mode. As has been explained with reference to FIG. 1, the test mode therefore determines alone whether or not data are output, which means that it is possible to check whether it has been activated.

Although the present invention has been described with reference to preferred exemplary embodiments, it is not limited thereto, but can be modified in a wide variety of ways.

One advantage of the present invention is that the described memory chip and the described testing apparatus make it possible to dispense with the prior art's customary data inversion indicating the test mode. This reduces the complexity of the memory chip and, in particular, the chip area. This is due, inter alia, to it being possible to dispense with inverters, latches, lines, etc.

Another advantage of the present invention is that omitting the inverters relieves the load on the data path within the memory chip, and faster operation of memory chips is therefore made possible.

Another advantage of the present invention is that the circuits required for enabling the device for outputting data or the off-chip driver are already present in customary memory chips, such as an SDRAM.

What is claimed is:

1. Memory chip which can be operated in a normal mode and in a test mode, having the following features:
   (a) a device for outputting data from the memory chip;
   (b) a device for enabling the device for outputting data when the test mode has been activated;
   (c) wherein the device for enabling the device for outputting data has a device for masking data so that only particular portions of the data are output when a data masking state has been activated; and
   (d) further wherein the enabling device enables the device for outputting data when the data masking state and the test mode have been activated, and does not enable it when the data masking state has been activated and the test mode has not been activated.

2. Memory chip according to claim 1, wherein the enabling device has a NOR gate which combines the logic state of the test mode with the negated logic data masking state.

3. Memory chip which can be operated in a normal mode and in a test mode, having the following features:
   (a) a device for outputting data from the memory chip; and
   (b) a device for enabling the device for outputting data when the test mode has been activated;
   wherein the device for outputting data has an off-chip driver.

4. Memory chip which can be operated in a normal mode and in a test mode, having the following features:
   (a) a device for outputting data from the memory chip;
   (b) a device for enabling the device for outputting data when the test mode has been activated; and
   (c) internal voltage sources which can be deactivated when the test mode has been activated.

5. Apparatus for testing a memory chip, the memory chip capable of being operated in a normal mode and in a test mode and comprising a device for outputting data from the memory chip and a device for enabling the device for outputting data when the test mode has been activated, the apparatus comprising:
   (a) a device for continuously sending data to the memory chip and receiving data from the memory chip; and
   (b) a device for checking the activation of the test mode for the memory chip;
   where the checking device determines that the test mode has been activated if the device for continuously sending and receiving is continuously receiving data from the memory chip.

6. Apparatus for testing a memory chip according to claim 5, additionally having the following feature:
   (a) a device for activating and deactivating the data masking state of the memory chip, which device activates the data masking state when the memory chip is operated in the test mode.

7. Method for testing a memory chip, the memory chip capable of being operated in a normal mode and in a test mode and comprising a device for outputting data from the memory chip and a device for enabling the device for outputting data when the test mode has been activated, the method comprising the steps of:
   (a) continuous sending of data to the memory chip and reception of data from the memory chip; and
   (b) checking of the activation of the test mode for the memory chip;
   where the checking step determines that the test mode has been activated if data are continuously received from the memory chip.

8. Method for testing a memory chip according to claim 7, additionally having the following step:
   (a) activation of the data masking state of the memory chip when the memory chip is in the test mode.

* * * * *